United States Patent
Gopinath et al.

(10) Patent No.: US 7,211,509 B1
(45) Date of Patent: May 1, 2007

(54) METHOD FOR ENHANCING THE NUCLEATION AND MORPHOLOGY OF RUTHENIUM FILMS ON DIELECTRIC SUBSTRATES USING AMINE CONTAINING COMPOUNDS

(75) Inventors: Sanjay Gopinath, Fremont, CA (US); Jeremie Dalton, San Jose, CA (US); Jason M. Blackburn, Santa Clara, CA (US); John Drewery, Alameda, CA (US); Willibrordus Gerardus Maria van den Hoek, Saratoga, CA (US)

(73) Assignee: Novellus Systems, Inc,, San Jose, CA (US)

( * ) Notice: Subject to any disclaimer, the term of this patent is extended or adjusted under 35 U.S.C. 154(b) by 0 days.

(21) Appl. No.: 10/868,384

(22) Filed: Jun. 14, 2004

(51) Int. Cl.
*H01L 21/4763* (2006.01)

(52) U.S. Cl. ...................... 438/650; 438/686

(58) Field of Classification Search ................ 438/648, 438/650, 686
See application file for complete search history.

(56) References Cited

U.S. PATENT DOCUMENTS

| 6,063,705 | A | | 5/2000 | Vaartstra ...................... 438/681 |
| 6,417,115 | B1 | * | 7/2002 | McDevitt et al. ............ 438/778 |
| 6,989,599 | B1 | * | 1/2006 | Iwasaki et al. ............. 257/751 |
| 2001/0043453 | A1 | * | 11/2001 | Narwankar et al. ....... 361/306.3 |
| 2004/0214354 | A1 | * | 10/2004 | Marsh et al. .................. 438/3 |
| 2005/0118807 | A1 | * | 6/2005 | Kim et al. ...................... 438/3 |
| 2006/0093848 | A1 | * | 5/2006 | Senkevich et al. .......... 428/585 |

OTHER PUBLICATIONS

U.S. Appl. No. 10/772,109, entitled "Use of Metallocenes to Inhibit Copper Oxidation during Semiconductor Processing", by Dalton et al., filed on Feb. 3, 2004.

* cited by examiner

Primary Examiner—Trung Dang
(74) Attorney, Agent, or Firm—Beyer Weaver, LLP.

(57) ABSTRACT

Methods for depositing a ruthenium metal layer on a dielectric substrate are provided. The methods involve, for instance, exposing the dielectric substrate to an amine-containing compound, followed by exposing the substrate to a ruthenium precursor and an optional co-reactant such that the amine-containing compound facilitates the nucleation on the dielectric surface.

24 Claims, 7 Drawing Sheets

METHOD FOR ENHANCING THE NUCLEATION AND MORPHOLOGY OF RUTHENIUM FILMS ON DIELECTRIC SUBSTRATES USING AMINE CONTAINING COMPOUNDS

CROSS-REFERENCE TO RELATED APPLICATIONS

This application is related to U.S. patent application Ser. No. 10/772,109, filed on Feb. 3, 2004, entitled "USE OF METALLOCENES TO INHIBIT COPPER OXIDATION DURING SEMICONDUCTOR PROCESSING" by Dalton et al., which application is incorporated herein by reference in its entirety for all purposes.

FIELD OF THE INVENTION

This invention relates to methods for depositing ruthenium on a dielectric substrate. More specifically it relates to methods for depositing a smooth, uniformly thick ruthenium nucleation layer on dielectric or metal barriers by using a nucleation catalyst.

BACKGROUND

As device geometries continue to shrink, one of the challenges facing the semiconductor industry is the deposition of thin, continuous films for use as copper diffusion barriers and as seeds for electroplating. The inability to grow thin, continuous metal films by chemical vapor deposition or pulsed layer deposition is often due to the inability of the metal films to nucleate on the dielectric surface. This has been found to be especially true for depositing ruthenium on $SiO_2$ It is believed that the process involves the chemisorption of a continuous layer of the nucleation catalyst on the dielectric surface followed by chemical deposition of the ruthenium films. This layer will be referred to throughout this application as a "catalytic nucleation layer". It is believed that the presence of the amine ligand enhances the reactivity of the substrate towards ruthenocene molecules thereby allowing nucleation and coalescence of the ruthenium films to proceed more rapidly. The phenomenon is not well understood, but it is likely a combination of enhanced chemical reactivity of the treated surface towards the precursor module and a higher energy barrier to surface diffusion of the precursor molecule on the treated surface. This results in smaller and more densely populated nuclei in the early deposition stage. This also leads to reduced activation energy, which in turn leads to reduced deposition temperature.

Thus, one area of particular concern is efficient nucleation of deposited metal layers. "Nucleation" refers to the initial formation of metal nuclei on a substrate such as a dielectric layer. Often the process conditions present a kinetic barrier to formation of such nuclei. In such cases, there may be a delay in deposition between the time when the substrate is exposed to metal precursor and the time when the metal actually begins to form on the surface. The problem may also be manifested by higher substrate temperatures required to initiate nucleation during the process.

Additionally, current methods for the deposition of ruthenium on $SiO_2$ form rough, non-uniform films, often with incomplete coverage.

What is needed, therefore, is a process for allowing a reduction in nucleation delay and improvement of morphology of ruthenium films.

SUMMARY

To achieve the foregoing, and in accordance with the purpose of the present invention, methods for improving the morphology of ruthenium metal layers, are disclosed.

In one embodiment of the invention, a dielectric substrate is first exposed to an amine-containing compound and followed with an exposure to a ruthenium precursor and an optional co-reactant.

The exposure to the precursor and amine-containing compounds occurs at a temperature of between about 20 to 450° C., although each step need not be at the same temperature.

The amine-containing compound may be any of various metal-amine complexes, pure amines, and non-metal amine complexes such as tetrakis(dimethylamino)silane (TDMS), Dimethylamine, Diethylamine, Trimethylamine, Tris(dimethylamino)silane. Specific metal-amine complexes include, for example, pentakis(dimethylamino)tantalum (PDMAT), TMAT Tetrakis(ethylmethylamino)tantalum, tetrakis(diethylamido) titanium (TDEAT), Tetrakis(dimethylamino)titanium (TDMAT), Tetrakis(ethylmethylamino)titanium (TEMAT), and t-butylamino tris(diethylamino)tantalum (TDBDET), Bis(diethylamino)bis(dimethylamino)titanium, Tetrakis(dimethylamino)hafnium, Tetrakis(dimethylamino) zirconium, Bis(mu-dimethylamino)tetrakis(dimethylamino) dialuminum.

Various ruthenium precursors may be used, including ruthenocene, ethyl ruthenocene, tris(acetylacetonate)ruthenium, triruthenium dodecacarbonyl, ruthenium pentacarbonyl, tris(acetylacetonate)ruthenium, ruthenium carbonyl chloride, Bis(tetramethylheptanedionato)(cyclooctadiene) ruthenium, Tris(tetramethylheptanedionato)ruthenium, (dimethylpentadienyl)(ethylcyclopentadienyl)ruthenium and penta(trifluorophosphine)ruthenium. Possible oxidizing co-reactants being Nitric Oxide (NO), Nitrous Oxide ($N_2O$), Oxygen ($O_2$), Ozone ($O_3$), CarbonDioxide ($CO_2$), Carbon Monoxide (CO), to name a few. Possible reducing co-reactants being Hydrogen ($H_2$), Diborane ($B_2H_6$), Silane ($SiH_4$), Disilane ($Si_2H_6$), Ammonia ($NH_3$) to name a few.

Further, in one embodiment of the invention, the exposure to a ruthenium precursor and an optional co-reactant occurs cyclically, thus allowing for a higher quality nucleation layer to be formed. Additionally, in still another embodiment of the invention, the dielectric is exposed to ammonia after having been exposed to an amine-containing compound, followed by a second exposure of the amine-containing compound and followed by exposure to ruthenium and an optional reactant.

According to one embodiment of the invention, each ruthenium metal layer thus produced has a thickness of between about 10 to 100 Å. In a second embodiment, the thickness is between about 10 to 60 Å.

Further, according to one embodiment of this invention, the roughness of the ruthenium film produced is in the range of about 1/10 to 1/2 the thickness of the ruthenium film.

This method may be used to apply a metal layer on a copper-containing integrated circuit. Additionally, the ruthenium precursor may be ruthenocene, which also serves to passivate the copper prior to exposure to an oxidizing agent.

DETAILED DESCRIPTION OF A PREFERRED EMBODIMENT

Introduction and Overview

The method disclosed proposes the use of amine containing compounds such as metal-amide complexes, pure amines, and non-metal amine complexes as nucleation catalyst for ruthenium films. While not wishing to be limited by theory, it is believed that the process involves the chemisorption of a layer of the nucleation catalyst on the dielectric surface. This layer will be referred to throughout this application as a "catalytic nucleation layer". It is believed that the presence of the amine ligand enhances the reactivity of the substrate towards ruthenocene molecules thereby allowing nucleation and coalescence of the ruthenium films to proceed more rapidly. The phenomenon is not well understood, but it is likely a combination of enhanced chemical reactivity of the treated surface towards the precursor module and a higher energy barrier to surface diffusion of the precursor molecule on the treated surface. This results in smaller and more densely populated nuclei in the early deposition stage. This also leads to reduced activation energy, which in turn leads to reduced deposition temperature.

Process

Conceptually, deposition of a ruthenium layer can be divided into an initial ruthenium "nucleation phase" (initial phase) and formation of a ruthenium "bulk phase." Thermodynamically and kinetically, the two stages of the process are distinct. In fact, it is the slow kinetics of nucleation that necessitates the present invention. For the purposes of this invention, a nucleation phase is defined as the period in which deposition of ruthenium occurs on a surface that is not ruthenium. In contrast, once a continuous film has been formed, any additional ruthenium deposited is considered to be part of the bulk layer.

Figure 1:
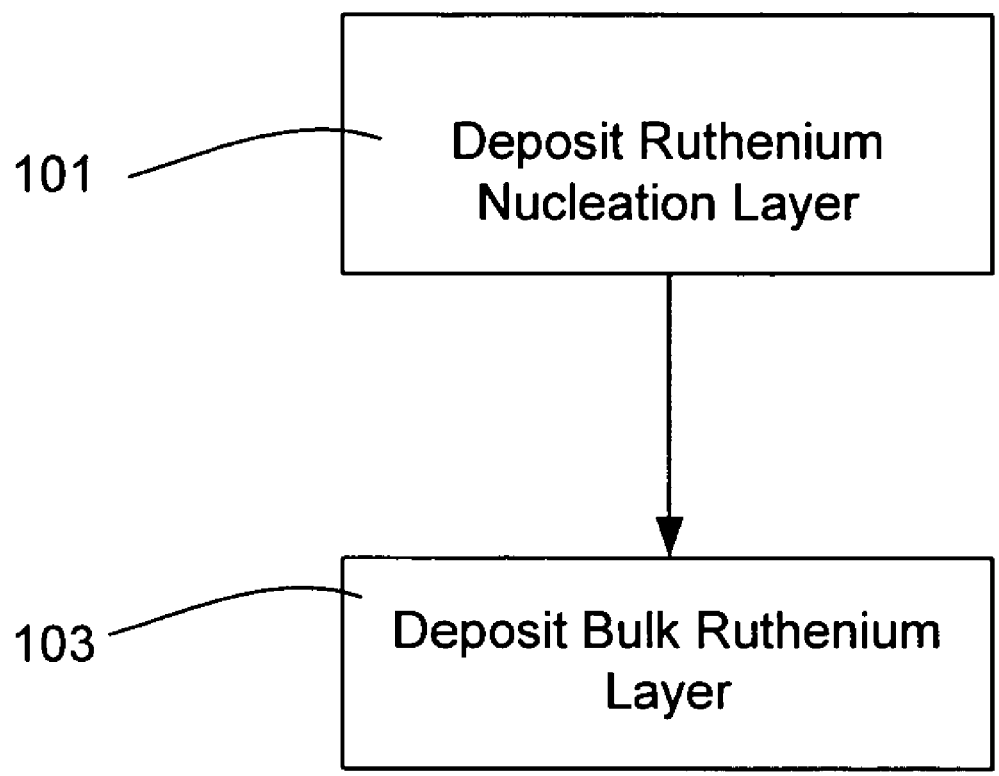
FIG. 1 is a block diagram illustrating the basic two-step process involved in creating a smooth, uniform ruthenium layer on a substrate.

FIG. 1 is a block diagram illustrating the basic two-step process involved in creating a smooth, uniform ruthenium layer on a substrate. The substrate could consist of a dielectric or a combination of $SiO_2$, SiN, CORAL™, using processes available from Novellus Systems, Inc., and other dielectric surfaces with copper at the bottom of the vias, as would be in the case of dual damascene structures. In the first step, 101, the substrate is placed in a reaction chamber and exposed to a nucleation catalyst. This nucleation catalyst is adsorbed onto the substrate and forms a catalytic nucleation layer on the surface of the substrate. In step 103, a ruthenium precursor is introduced into the chamber in order to form a bulk ruthenium layer. The two steps are often performed in the same chamber, but each step may be also performed in a separate chamber. Furthermore, since both the growth phases require a ruthenium precursor and an optional co-reactant, it is preferable, but not necessary, that these materials be the same for both the nucleation and bulk growth phases.

If both the nucleation catalyst and the ruthenium film are applied in the same chamber, the reaction temperature for applying layers is about between 20–450° C., more preferably at between about 250 to 350° C., and the chamber pressure is between about 0.1–100 Torr for step 101 and between about 0.1–100 Torr for step 103. Note that the pressure and temperature for step 101 does not have to be the same or step 103. Note further that the process will generally not employ an amine-containing material during formation of the bulk ruthenium layer. Rather, only a ruthenium precursor together with an optional co-reactant such as oxygen and a carrier gas will be employed during the bulk layer deposition phase of the process. For purposes of high throughput and low contamination, it will often be desirable to use a simple chemical vapor deposition process to form the bulk component of the ruthenium layer. In other embodiments, however, a cyclic process such as ALD may be employed to form the bulk component. If CVD is employed, the ruthenium precursor, the co-reactant, and the carrier gas are continually flowed to the process chamber during the bulk deposition phase until the necessary thickness of ruthenium is formed. If an ALD type process is employed, the ruthenium precursor and co-reactant are alternately delivered to the substrate (and adsorbed on the surface) to build up the ruthenium bulk layer, incrementally.

One or more ruthenium precursors such as ruthenocene, ethyl ruthenocene, tris(acetylacetonate)ruthenium, triruthenium dodecacarbonyl, ruthenium pentacarbonyl, tris(acetylacetonate)ruthenium, ruthenium carbonyl chloride, (dimethylpentadienyl)(ethylcyclopentadienyl)ruthenium, bis(tetramethylheptanedionato)(cyclooctadiene)ruthenium, tris(tetramethylheptanedionato)ruthenium or penta(trifluorophosphine)ruthenium may be used, alone or in combination, to form the ruthenium nucleation layer during the nucleation phase and for deposition of the ruthenium layer, or to passivate the copper features on the substrate, before exposing the copper to an oxidizing environment. The nucleation catalyst may be a variety of reactants, including metal-amide complexes such as pentakis(dimethylamino)tantalum (PDMAT), tetrakis(diethylamido)titanium (TDEAT), tetrakis(dimethylamino)titanium (TDMAT), tetrakis(ethylmethylamino)titanium (TEMAT), t-butylimino tris(diethylamino) tantalum (TDBDET), tetrakis(dimethylamino)silane, butyldimethyl(dimethylamino)silane, tris(dimethylamino)silane and others. Alternately, the nucleation catalyst may be a pure amine such as dimethylamine, trimethylamine, ethylamine, or others.

Figure 2:
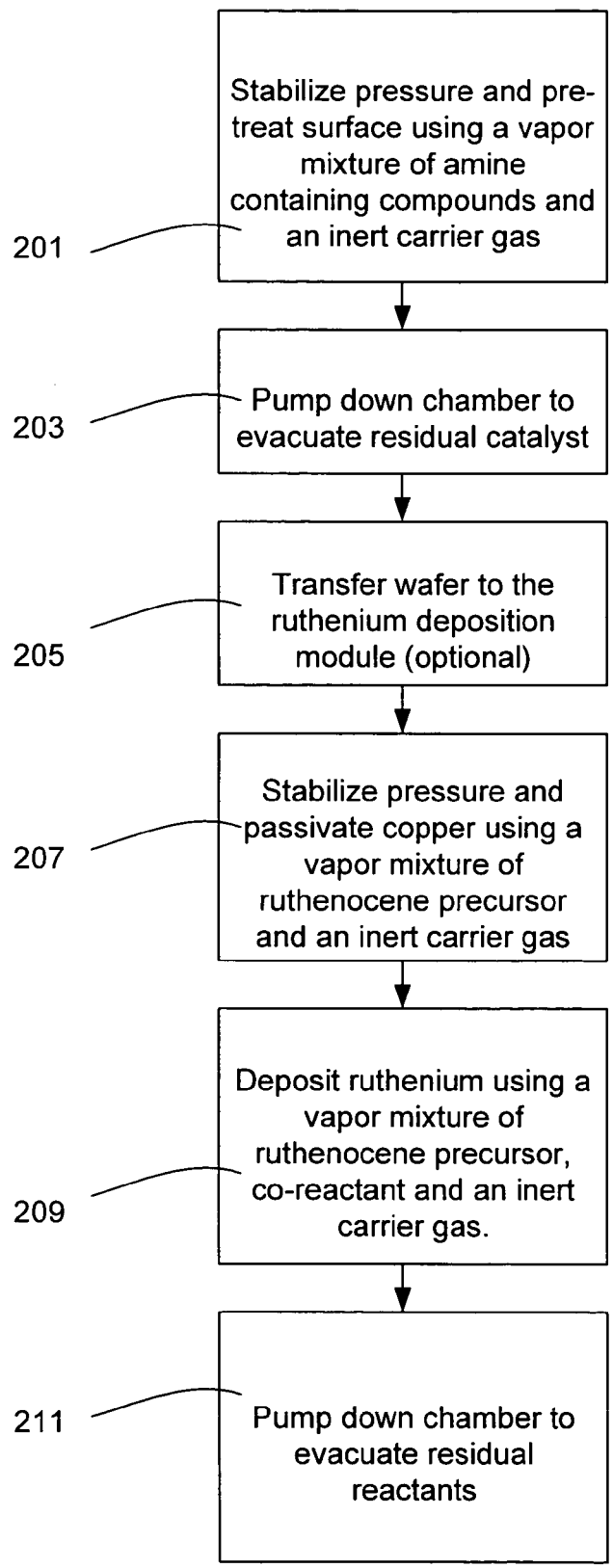
FIG. 2 is a block diagram illustrating a second embodiment of the present invention.
Figure 3A:
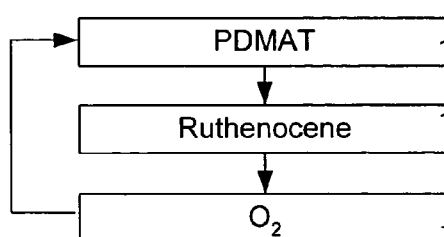
FIGS. 3(a)–3(f) are process flow diagrams of various embodiments of present invention.
Figure 3B:
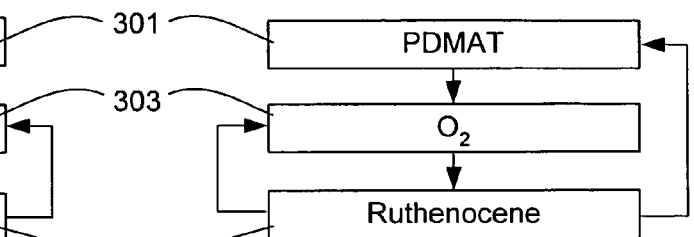
Figure 3C:
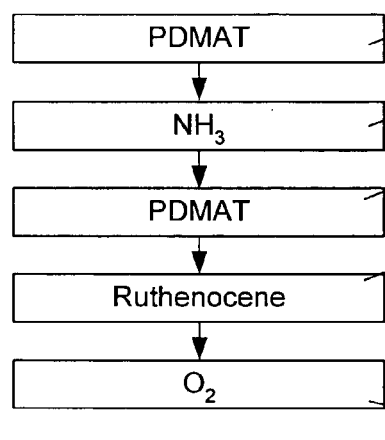
Figure 3D:
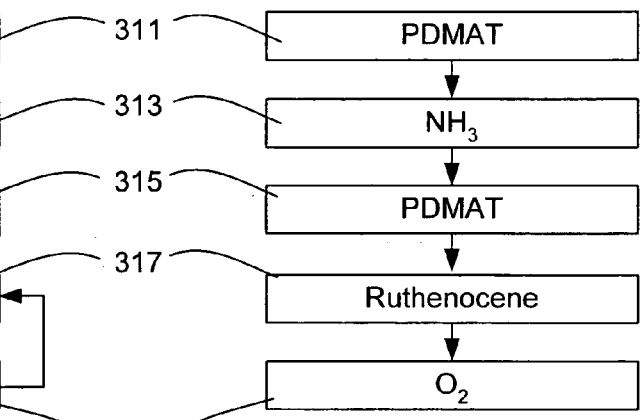
Figure 3E:
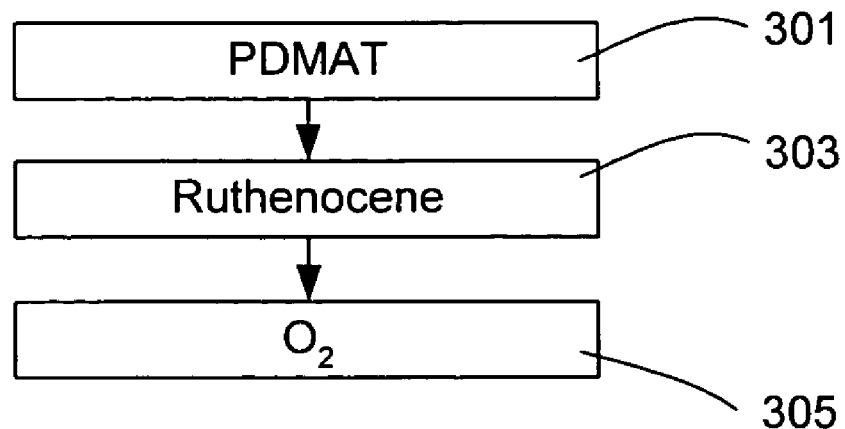
Figure 3F:
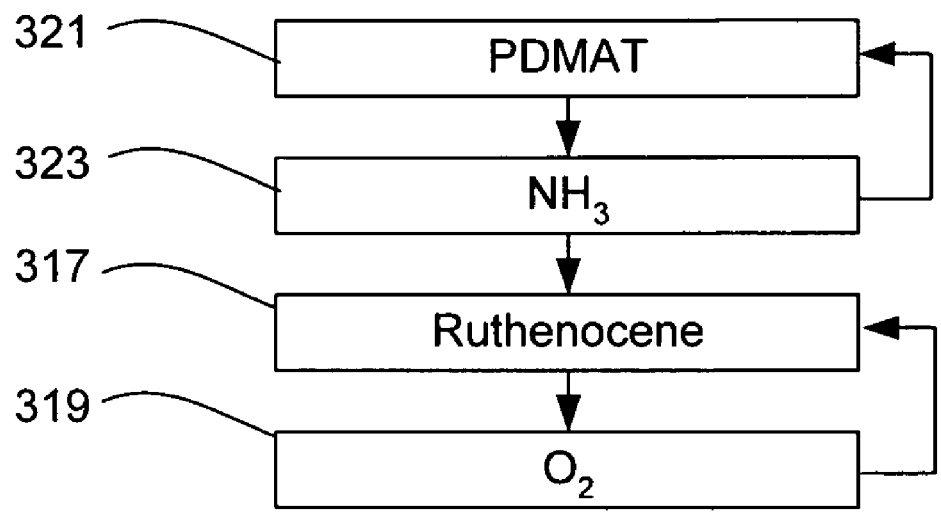

FIG. 2 is a block diagram illustrating a second embodiment of the present invention. The process begins after a wafer has been loaded into a chamber that has a heated pedestal. In step 201, the pressure in the chamber is stabilized using an inert carrier gas (e.g. argon.) Immediately after pressure stabilization, a vapor mixture of amine-containing compounds, which comprise the nucleation catalyst, is introduced to pre-treat the surface of the substrate. The substrate is exposed to the nucleation catalyst for a fixed period of time, allowing it to be adsorbed onto the substrate. The chamber is pumped and purged of the residual nucleation catalyst in step 203. In optional step 205, the wafer is transferred to a ruthenium deposition module. However, some implementations of the present invention will omit this optional step, electing instead to use the same chamber for both pre-treatment and ruthenium deposition. In the next step, 207, pressure is once again stabilized and any copper on the substrate is passivated using a vapor mixture of a ruthenium precursor such as, for example ruthenocene, and an inert carrier gas such as, for example, argon. This passivation step is necessary for subsequent treatment steps that require an oxidizing chemistry in order to prevent the corrosion of copper. A discussion of the passivation of copper using ruthenocene may be found in U.S. patent application Ser. No. 10/772,109, discussed above.

During step 209, a ruthenium layer is deposited using a vapor mixture of a ruthenium precursor, an optional oxidizer such as, for example, Nitric Oxide (NO), Nitrous Oxide ($N_2O$), Oxygen ($O_2$), Ozone ($O_3$), Carbon Dioxide ($CO_2$), Carbon Monoxide (CO), to name a few, or an optional reducer Hydrogen ($H_2$), Diborane ($B_2H_6$), Silane ($SiH_4$), Disilane ($Si_2H_6$), Ammonia ($NH_3$) to name a few, and an inert carrier gas. Finally, in step 211 the chamber is pumped down to evacuate residual reactants.

The process outlined in FIG. 2 may be performed in a single linear path as shown in the diagram as in a CVD process. However, this process may also be performed in a cyclic fashion. Each cycle after the first cyclic can include various subsets of the six steps. In one approach, the process simply moves back to the first step after the sixth step is completed and continues passing through these six steps until the ruthenium layer has been deposited to the required thickness. Optional step 205 depends on the apparatus employed to perform the method. The passivation step 207 may be unnecessary after the first iteration or some subsequent iteration after, if the exposed copper has been sufficiently passivated. Eliminating step 207 simply means that the ruthenium precursor and co-reactant are introduced at the same time, rather than having the ruthenium precursor introduced before the co-reactant is added.

In one alternative version of the cyclic process, the process loops back to step 207 after step 211 is completed and repeats step 207 through 211 until a ruthenium layer has been deposited to the required thickness. Note that in this version of the cyclic process, it may be desirable to perform step 209 in a manner that includes no ruthenium precursor. In other words, step 207 exposes the substrate to the ruthenium precursor, which adsorbs on the surface of the dielectric. Step 209 then exposes the substrate (with adsorbed ruthenium precursor) to a co-reactant, which reacts with the adsorbed precursor to form metallic ruthenium. This is more in line with a standard atomic layer deposition (ALD) process. Note that it may be appropriate to purge the ruthenium precursor from the reaction chamber before introducing the co-reactant. The deposition process might involve a co-reactant in the free radical form.

The appropriate temperature range for steps 201 and 207 falls somewhere within the range of about 20 to 450° C. However, the amine exposure step is more preferably in the range of about 100 to 450° C. (e.g., 150° C.). The ruthenium precursor exposure and deposition steps are preferably performed at a temperature of about 200 to 350° C. However, if both exposures are to be performed in the same reaction chamber, then it is preferable to use only a single temperature (preferably about 250 to 350° C.).

FIGS. 3(*a*)–3(*f*) are process flow diagrams of various embodiments of present invention. FIGS. 3(*a*)–3(*c*) and 3(*f*) represent ALD applications and involve repeating a sequence of steps to form the nucleation layer. FIGS. 3(*d*)–3(*e*) represent CVD type processes that occur in a single pass. Although specific compounds are shown in each diagram, it is understood that other similar compounds may be used as detailed in this application and as understood by those skilled in the art.

FIG. 3(*a*) is an ALD process which starts with exposing a surface to a nucleation catalyst, in this case PDMAT, followed by a ruthenium precursor, in this case ruthenocene, followed by a co-reactant, in this case $O_2$. The process than either cycles back to the beginning of the process or to the point where the substrate is exposed to ruthenocene. FIG. 3(*b*) shows a slight variation of this process, wherein order of the co-reactant $O_2$ and ruthenocene exposure steps is reversed. FIG. 3(*c*) is a third variation of the process where a surface is first exposed to PDMAT, then to ammonia, and then to PDMAT again. This initial exposure of PDMAT is followed by exposure to ruthenocene followed by co-reactant $O_2$.

The cycling in FIGS. 3(*a*)–3(*c*) continues for as long as necessary to form a film of desired thickness. Note that there are other possibilities in terms of where in the process flow the cycling occurs. For instance, there might be several doses of $NH_3$ interspaced with several doses of PDMAT as a variation of the process shown in FIG. 3(*c*).

FIGS. 3(*d*) and 3(*e*) are process flow diagrams showing CVD processes according to one embodiment of the invention. FIG. 3(*d*) has the same steps as in FIG. 3(*c*), but without the cycling of the last two steps. FIG. 3(*e*) is a CVD embodiment of the invention where the amine-containing compound is PDMAT, that ruthenium precursor is ruthenocene, and the co-reactant.

FIG. 3(*f*) is a process flow diagram showing an ALD process according to one embodiment of the invention. In this embodiment, a layer of tantalum nitride (TaN) is applied to a substrate by first exposing it to PDMAT (step 321). After the exposure to PDMAT, the reaction chamber is purged of residual PDMAT (not shown). In step 323, the substrate is then exposed to $NH_3$, followed by a second purging of the reaction chamber (not shown). If desired, optional steps 321 through 323 are repeated until a desired thickness of TaN has been reached. If a ruthenium film is to be deposited over the TaN layer, optional steps 317 and 319, described in reference to FIGS. 3(*c*) and 3(*d*) are then performed one or more times until a film of desired thickness has been formed. Depending on process conditions such as pressure and temperature, the layer deposited may have a carbon content as well (tantalum carbon nitride TaNC). The ratio of nitrogen and/or carbon to tantalum will vary, depending on process conditions. As will be understood by those skilled in the art, these ratios may or may not be stoichiometric. Also, for the purposes of these materials, the term "nitride" is taken to mean "containing nitrogen," rather than specifying any particular stoichiometry.

Note that other metal nitrides may be deposited according to the embodiment described in FIG. 3(*f*). If a TaN (or TaNC) layer is desired, metal-amine complexes such as TMAT Tetrakis(ethylmethylamino)tantalum and t-butylamino tris(diethylamino)tantalum (TDBDET) may also be substituted for PDMAT in step 321. A titanium nitride layer may be deposited by substituting tetrakis(diethylamido) titanium (TDEAT), Tetrakis(dimethylamino)titanium (TDMAT) or Tetrakis(ethylmethylamino)titanium (TEMAT) in step 321. Further, metal nitride layers of hafnium, zirconium, and aluminum may be deposited as well, by substituting, respectively, Tetrakis(dimethylamino)hafnium, Tetrakis(dimethylamino)zirconium, and Bis(mu-dimethylamino)tetrakis(dimethylamino)dialuminum in step 321. It will be recognized by those skilled in the art, that other metal-amine complexes may be appropriate to create these metal nitride layers as well. In all cases, these materials will be referred to throughout this application as "metal nitrides", regardless of the actual ratio of metal to nitrogen.

TaN, TaNC and other metal nitride layers prepared using, for example, the method described above in reference to FIG. 3(*a*)–3(*f*), are appropriate for use as nucleation seed layers for depositing ruthenium films. Additionally, TaN, TaNC, and TiN layers are appropriate for use as barrier layers on a substrate.

Apparatus

The present invention can be implemented in many different types of apparatus. Generally, the apparatus will include one or more chambers or "reactors" (sometimes including multiple stations) that house one or more wafers and are suitable for wafer processing. A single chamber may be employed for all operations of the invention or separate chambers may be used. Each chamber may house one or more wafers for processing. The one or more chambers maintain the wafer in a defined position or positions (with or without motion within that position, e.g. rotation, vibration, or other agitation). The various stations may be wholly or partially isolated by virtue of gas curtains, walls, etc. In such cases, the substrate may be indexed between different stations during a multistage process. In one example, a first station is used for passivating the substrate with a metallocene, a second chamber is employed for depositing a barrier layer on the passivated substrate, etc.

Figure 4:
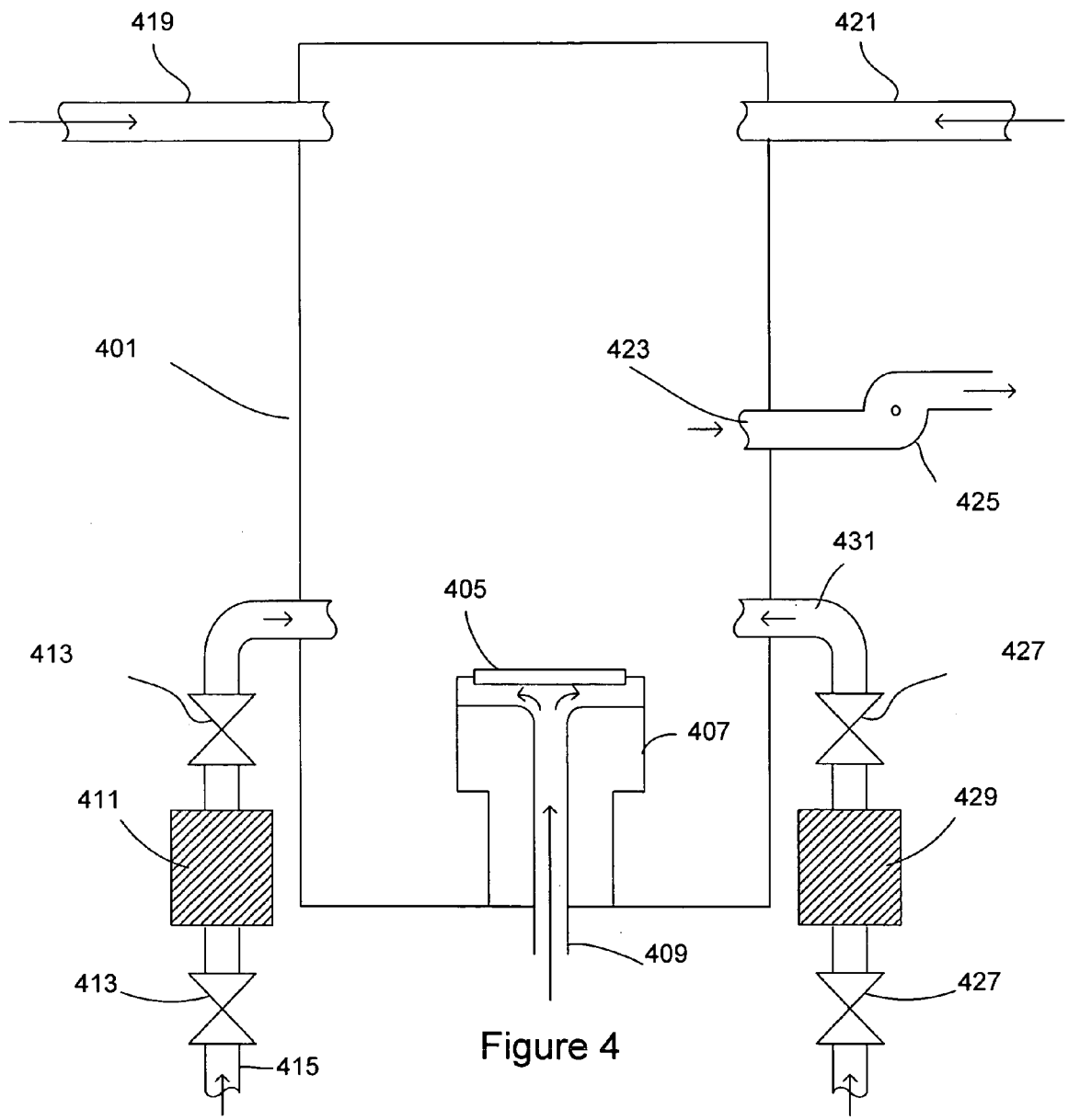
FIG. 4 is a block diagram depicting various reactor components arranged as in a conventional reactor.

FIG. 4 provides a simple block diagram depicting various reactor components arranged as in a conventional reactor. As shown, a reactor 401 includes a process chamber 403 (not shown in figure), which encloses other components of the reactor. A substrate 405 is placed upon a temperature-controlled pedestal 407. A vacuum pump 425 is used to evacuate the air from process chamber 403 via vacuum line 423. The temperature of substrate 405 may be controlled by use of a "backside" gas line 409. The backside gas may be any inert gas heated or cooled to the desired temperature. A metallocene precursor is provided and its vapor fed into a carrier gas feed line 415. Isolation valves 413 are used to separate the metallocene vapor from the reactor and the carrier gas until the desired time. When the valves are open, a carrier gas forces the metallocene vapor into the chamber. The carrier gas may be any inert gas, such as argon. A diluent gas may be supplied through carrier line 419. The diluent gas may be any inert gas such as argon, nitrogen (depending on the process), helium, etc. A co-reactant gas, such as molecular oxygen ($O_2$), is supplied through line 421.

Applications

This invention may be used as a surface pretreatment for the reduction in nucleation delay and improvement of morphology of ruthenium films deposited using ruthenocene precursor compounds on a plurality of dielectric surfaces. The resulting ruthenium film is much smoother than films prepared without the use of the present invention. Smooth films are desirable to produce the most stable barriers as the number of thin spots, through which copper diffuses through fastest, is reduced.

Additionally, one implementation of the ALD embodiment discussed in reference to FIG. 3(a)–3(f) may be used to create barrier layers on dielectric surfaces, namely TiN, TaN, or TaNC layers.

EXPERIMENTAL EXAMPLES

A series of experiments were run to demonstrate the catalytic effect of pentakis(dimethylamino)tantalum (PDMAT). Controls were run without any catalytic soak to demonstrate the extent of reduction in nucleation delay.

Figure 5:
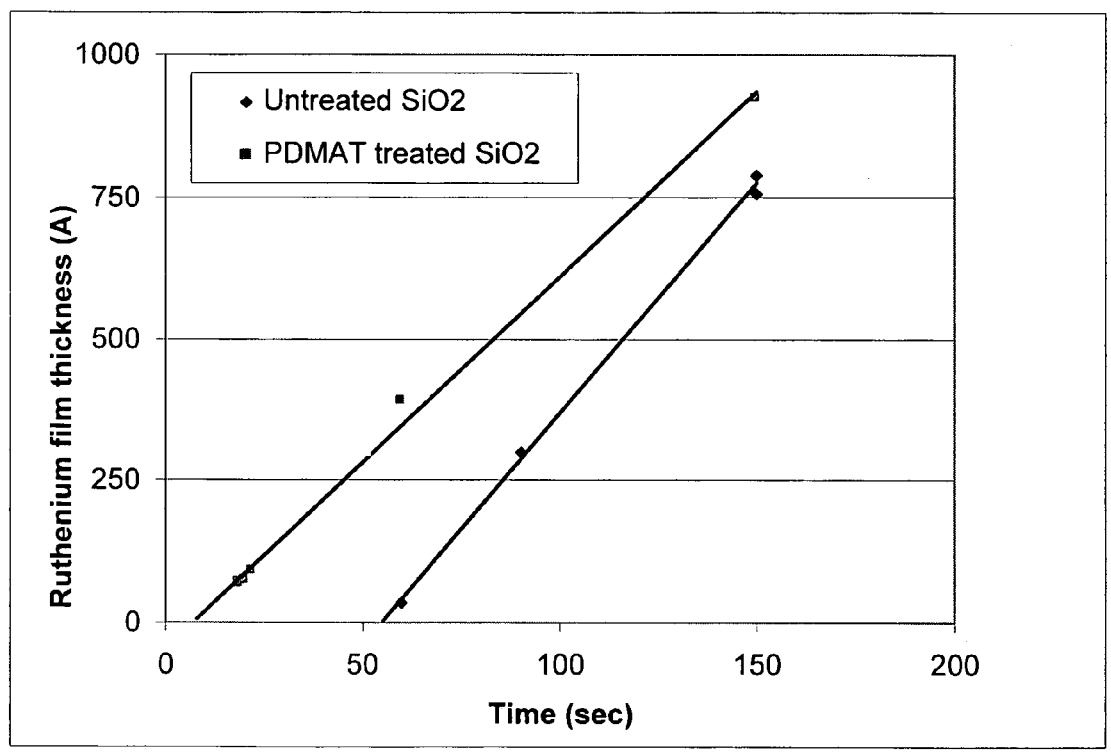
FIG. 5 is a comparison of ruthenium growth rate on $SiO_2$ with and without a PDMAT surface treatment.

FIG. 5 shows the growth rate of ruthenium on $SiO_2$ with and without a PDMAT catalytic treatment. The ruthenium films are deposited using $Ru(Cp)_2$ and $O_2$. It is evident that the metal amide pretreatment reduces the nucleation delay of ruthenium CVD from 54 seconds to less than 7 seconds. The deposition time of these films from $Ru(Cp)_2$ can be on the order of 10s.

Figure 6A:
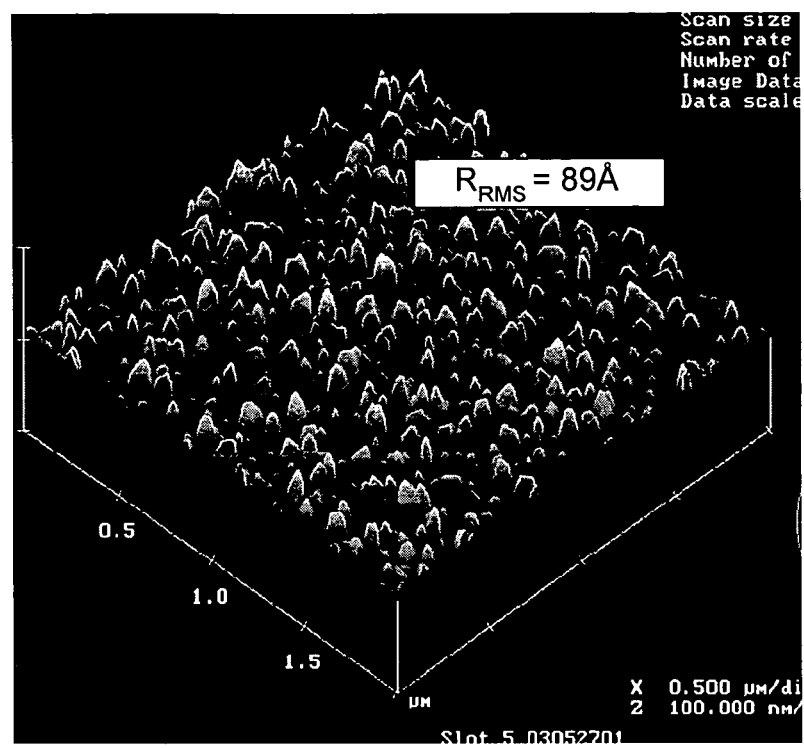
FIG. 6—AFM images of Ruthenium film on $SiO_2$ (a) without surface treatment and (b) with PDMAT surface treatment.
Figure 6B:
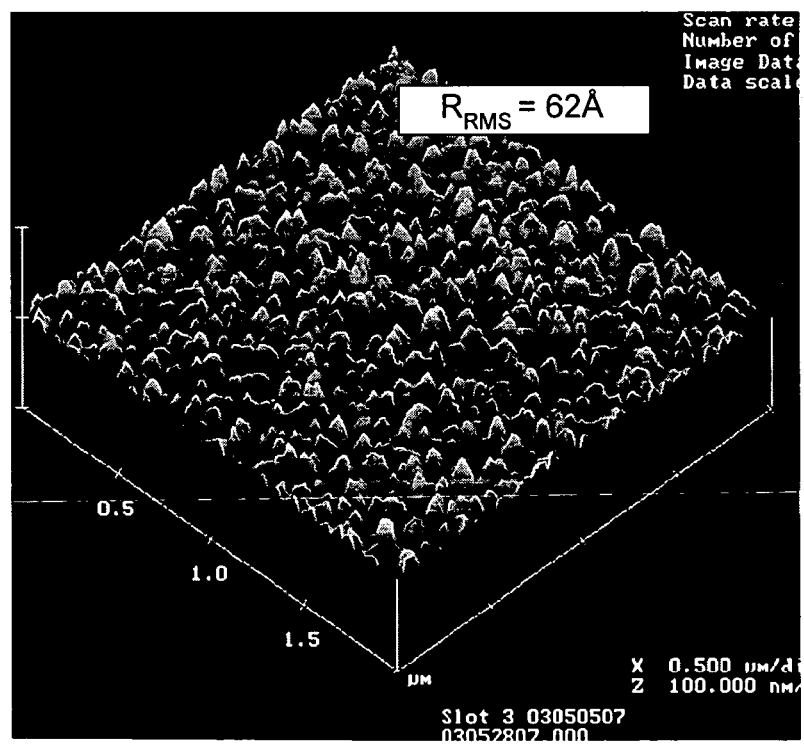

Metal amide treatment has also improves the roughness of the ruthenium film, as can be seen from the AFM images in FIG. 6. The roughness of the CVD Ru film on $SiO_2$ has been reduced from 89 Å (FIG. 6a) to 62 Å (FIG. 6b) using a metal amide pretreatment. The surface roughness of metal amide treated ruthenium films decreases with decreasing ruthenium film thickness.

OTHER EMBODIMENTS

While this invention has been described in terms of certain embodiments, there are various alterations, modifications, permutations, and substitute equivalents, which fall within the scope of this invention. For example, while this application has primarily focused on deposition of ruthenium on dielectric layers using amine compounds for pretreatment, the invention is not limited to ruthenium and amine-containing catalytic nucleation layers can be employed for the same purpose to deposit other types of metal layers such as nickel, cobalt, iron, palladium and platinum on a dielectric surface. It should also be noted that there are many alternative ways of implementing the methods and apparatuses of the present invention. Further, there are numerous applications of the present invention, both inside and outside the integrated circuit fabrication arena. It is therefore intended that the following appended claims be interpreted as including all such alterations, modifications, permutations, and substitute equivalents as fall within the true spirit and scope of the present invention.

What is claimed is:

1. A method of depositing a ruthenium metal layer on a dielectric substrate, the method comprising:
    (a) exposing the dielectric substrate to a metal-amine complex; and
    (b) exposing the substrate to a ruthenium precursor and an optional co-reactant, whereby ruthenium nucleation on the dielectric surface is facilitated by the metal-amine complex or a metal-nitride derivative thereof.

2. The method of claim 1, wherein the metal-amine complex is selected from the group consisting of pentakis (dimethylamino)tantalum (PDMAT), TMAT Tetrakis(ethylmethylamino)tantalum, tetrakis(diethylamido)titanium (TDEAT), t-butylamino tris(diethylamino)tantalum (TDBDET) tetrakis(dimethylamino)titanium (TDMAT), and tetrakis(ethylmethylamino)titanium (TEMAT).

3. The method of claim 1, wherein the ruthenium precursor is selected from the group consisting of ruthenocene, ethyl ruthenocene, tris(acetylacetonate)ruthenium, triruthenium dodecacarbonyl, ruthenium pentacarbonyl, tris(acetylacetonate)ruthenium, ruthenium carbonyl chloride, (dimethylpentadienyl)(ethylcyclopentadienyl)ruthenium, bis (tetramethylheptanedionato)(cyclooctadiene)ruthenium, tris (tetramethylheptanedionato)ruthenium and penta (trifluorophosphine)ruthenium.

4. The method of claim 1, wherein the dielectric substrate is exposed to the amine-containing compound at a temperature of about 20 to 450° C.

5. The method of claim 1, wherein the dielectric substrate is exposed to the ruthenium precursor at a temperature of about 20 to 450° C.

6. The method of claim 1, wherein the dielectric substrate is exposed to the amine-containing compound at a temperature of about 250 to 350° C.

7. The method of claim 1, wherein the optional co-reactant is an oxidizing co-reactant selected from the group consisting of Nitric Oxide (NO), Nitrous Oxide ($N_2O$), Oxygen ($O_2$), Ozone ($O_3$), Carbon Dioxide ($CO_2$), and Carbon Monoxide (CO).

8. The method of claim 1, where in the optional co-reactant is a reducing co-reactant selected from the group comprising Hydrogen ($H_2$), Diborane ($B_2H_6$), Silane ($SiH_4$), Disilane ($Si_2H_6$), and Ammonia ($NH_3$).

9. The method of claim 1, wherein thermal decomposition occurs during CVD.

10. The method of claim 1, wherein (b) is performed in a cyclic fashion such that the substrate is alternately exposed to the ruthenium precursor and the oxidizing agent.

11. The method of claim 1, wherein (a) further comprises exposing the dielectric to ammonia after the initial exposure to an amine-containing compound, followed by a second exposure to an amine-containing compound.

12. The method of claim 1, wherein the ruthenium metal layer has a thickness of about 10 to 100 Å.

13. The method of claim 1, wherein the ruthenium metal layer is a nucleation layer having a thickness of about 10 to 60 Å.

14. The method of claim 1, wherein the roughness of the resulting ruthenium metal layer is less than about one-half the thickness of the ruthenium film.

15. The method of claim 1, wherein the roughness of the resulting ruthenium metal layer is less than about one-tenth the thickness of the ruthenium film.

16. The method of claim 1, wherein the ruthenium metal layer is formed as a diffusion barrier on a copper-containing integrated circuit.

17. The method of claim 1, wherein the ruthenium precursor is ruthenocene, and whereby exposure to ruthenocene serves to passivate the copper prior to exposure to an oxidizing agent.

18. The method of claim 1, wherein the reaction temperature during steps (a) and (b) is between about 20–450° C.

19. The method of claim 1, wherein the reaction temperature during steps (a) and (b) is between about 250 to 350° C.

20. The method of claim 1, wherein the reaction temperature during step (a) is between about 100 to 450° C.

21. The method of claim 1, wherein the reaction temperature during step (b) is between about 200 to 350° C.

22. The method of claim 1, wherein the reaction temperatures during steps (a) and (b) are different.

23. The method of claim 1, wherein the chamber pressure during steps (a) and (b) is between about 0.1–100 Torr.

24. The method of claim 1, wherein the chamber pressures during steps (a) and (b) are different.

* * * * *

UNITED STATES PATENT AND TRADEMARK OFFICE
CERTIFICATE OF CORRECTION

| | |
|---|---|
| PATENT NO. | : 7,211,509 B1 |
| APPLICATION NO. | : 10/868384 |
| DATED | : May 1, 2007 |
| INVENTOR(S) | : Gopinath et al. |

Page 1 of 1

It is certified that error appears in the above-identified patent and that said Letters Patent is hereby corrected as shown below:

In the Specification:

Column 4, line 40, change "t-butylimino" to --t-butylamino--.

Signed and Sealed this

Twenty-ninth Day of April, 2008

JON W. DUDAS
*Director of the United States Patent and Trademark Office*